United States Patent
Yoo

(10) Patent No.: US 7,321,134 B2
(45) Date of Patent: Jan. 22, 2008

(54) ORGANIC ELECTROLUMINESCENT DISPLAY DEVICE AND METHOD FOR FABRICATING THE SAME

(75) Inventor: Choong Keun Yoo, Incheon (KR)

(73) Assignee: LG. Philips LCD Co., Ltd., Seoul (KR)

( * ) Notice: Subject to any disclaimer, the term of this patent is extended or adjusted under 35 U.S.C. 154(b) by 87 days.

(21) Appl. No.: 11/319,432

(22) Filed: Dec. 29, 2005

(65) Prior Publication Data

US 2006/0145602 A1   Jul. 6, 2006

(30) Foreign Application Priority Data

Dec. 30, 2004   (KR)   ............... 10-2004-0116136

(51) Int. Cl.
   *H01L 51/00* (2006.01)
(52) U.S. Cl. ............... 257/40; 438/99; 257/E51.019
(58) Field of Classification Search ............... 438/99; 257/40, E51.019
   See application file for complete search history.

(56) References Cited

U.S. PATENT DOCUMENTS

| 5,276,380 A | 1/1994 | Tang |
| 5,294,869 A | 3/1994 | Tang et al. |
| 5,294,870 A | 3/1994 | Tang et al. |
| 5,701,055 A | 12/1997 | Nagayama et al. |
| 5,742,129 A | 4/1998 | Nagayama et al. |
| 5,952,037 A | 9/1999 | Nagayama et al. |
| 6,046,547 A | 4/2000 | Nishio et al. |
| 6,175,345 B1 | 1/2001 | Kuribayashi et al. |
| 6,373,455 B1 | 4/2002 | Kuribayashi et al. |
| 6,548,961 B2 | 4/2003 | Barth et al. |
| 6,633,134 B1 | 10/2003 | Kondo et al. |
| 6,919,680 B2 | 7/2005 | Shimoda et al. |
| 2006/0145601 A1* | 7/2006 | Kim ............... 313/504 |

FOREIGN PATENT DOCUMENTS

| JP | 2001-117509 | 4/2001 |
| KR | 0365519 | 6/2002 |
| WO | WO-02/078101 | 10/2002 |

* cited by examiner

*Primary Examiner*—B. William Baumeister
*Assistant Examiner*—Minchul Yang
(74) *Attorney, Agent, or Firm*—Birch, Stewart, Kolasch & Birch, LLP

(57) ABSTRACT

An organic electroluminescent display device according to an embodiment includes a connection electrode on a first substrate; and a luminescent element on a second substrate opposite to the first substrate, the luminescent element being connected to the connection electrode, the luminescent element having a contact part at least partially surrounded by a separator, wherein a first electrode, a second electrode and an organic common layer between the first electrode and the second electrode are located in the contact part.

47 Claims, 5 Drawing Sheets

ORGANIC ELECTROLUMINESCENT DISPLAY DEVICE AND METHOD FOR FABRICATING THE SAME

This Nonprovisional Application claims priority under 35 U.S.C. §119(a) on Patent Application No. 10-2004-00116136 filed in Korea on Dec. 30, 2004, the entire contents of which are hereby incorporated by reference.

BACKGROUND OF THE INVENTION

1. Field of the Invention

The present invention relates to an electroluminescent display device (ELD), and more particularly, to an electroluminescent display having a dual-plate structure in which a thin film transistor array and an organic electroluminescent part are formed in separate substrates.

2. Discussion of the Related Art

Recently, flat displays are vigorously developed. Among the developed flat displays, liquid crystal displays (LCD), field emission displays (FED), electroluminescent devices (ELD), and plasma display panels (PDP) are spotlighted.

Among the flat displays, the LCD is widely used in personal information devices such as personal communication service terminals, laptop computers, TVs, etc. However, since the LCD has a narrow viewing angle and a longer response time, a self-luminescent organic electroluminescent display device is spotlighted.

The organic electroluminescent display device uses electroluminescence phenomena that an electric field is applied to a negative electrode and a positive electrode formed in the upper and lower sides of an organic emitting layer such that electrons and holes are inserted and transported into the organic emitting layer so that when the electrons and holes are recombined, the energy will be released in the form of a visible light. In other words, the electrons and the holes combine as hole-electron pairs and the hole-electron pairs emit light when returning from the excited state to the ground state.

Due to a faster response time, excellent brightness, and thin films, the organic electroluminescent display device can be driven at low voltage and display all colors within the visible spectrum. Therefore, the organic electroluminescent display device can satisfy modern people's tastes. Moreover, the organic electroluminescent display device can be implemented on a flexible transparent substrate such as a plastic substrate.

In addition, since the organic electroluminescent display device can be driven under a low voltage, consumes relatively low power, and easily displays three colors, i.e., green, red, and blue colors, the organic electroluminescent display device is ideal as a next generation flat display.

The organic electroluminescent display device can be divided into a passive matrix type and an active matrix type based upon the driving method thereof.

The passive matrix type organic electroluminescent display device has a simple structure and requires a simple manufacturing method. However, the passive matrix type organic electroluminescent display device has high power consumption and it is difficult to achieve a large-size organic electroluminescent display device. Moreover, the greater the number of lines, the lower the aperture ratio.

On the other hand, the active matrix type organic electroluminescent display device has high luminescent efficiency and provides high-density resolution.

Hereinafter, the conventional active matrix type organic electroluminescent display device, particularly, the conventional active matrix type organic electroluminescent display device having the dual-plate structure will be described in detail with reference to the accompanying drawings.

FIG. 1 illustrates a cross-sectional view of a conventional organic electroluminescent display device. FIG. 2 illustrates a plan view of the conventional organic electroluminescent display device.

As shown in FIG. 1, the conventional organic electroluminescent display device is fabricated by bonding a first transparent substrate 10 to a second transparent substrate using a sealant. A plurality of pixels (luminescent parts) P is defined on the first substrate 10, and thin film transistors T and array lines (not shown) are formed on the respective sides of the respective pixels P.

In other words, on the first substrate 10, the gate lines arranged in a single row, the data lines and power lines crossing each other and spaced apart from each other by a predetermined interval, the switching thin film transistors Ts (not shown) provided at locations where the gate lines cross the data lines, and the driving thin film transistors Tp provided at locations where the gate lines cross the power lines, are formed. The drain electrodes of the switching thin film transistors are connected to the gate electrodes 12a of the driving thin film transistors and the drain electrodes 15b of the driving thin film transistors are integrally formed with the connection electrodes 41.

Each set of the gate lines, the data lines and the power lines define a pixel region. The corresponding switching thin film transistor Ts and driving thin film transistors Tp are provided in the pixel region.

First electrodes 21 as transparent hole injection electrodes are formed on the upper side of the second substrate 20. Organic common layers 22 consisting of a hole injection layer and a hole transporting layer are formed on the upper side of the first electrodes 21. Organic luminescent layers 23 are formed on the organic common layers 22. Electron injection layers 25 are formed on the organic luminescent layers 23. Second electrodes 24 as electron injection electrodes are formed on the electron injection layers 25.

The second electrodes 24 receive the electric signals from the peripheral region surrounding the active region on which images are displayed, and the first electrodes 21 receive electric signals through the connection electrodes 41 in the contact parts C.

Each of the connection electrodes 41 is formed on the first substrate 10, and contacts the second electrode 24 when bonding the first substrate 10 to the second substrate 20 such that the signals are applied to the first and second electrodes.

The connection electrodes 41 contact the second electrodes 24 and cover the contact spacers 42. The contact spacers 42 have a column-shape with a predetermined height and are formed between the two substrates to maintain a cell gap.

The organic luminescent layers 23 express colors of red R, green G, and blue B, and separate organic materials are patterned in the respective pixels.

When an electric field is applied to the first electrodes 21 and the second electrodes 24 of the organic electroluminescent display device, electrons are injected into the organic luminescent layer 23 from the second electrodes 24, and holes are injected into the organic luminescent layer 23 from the first electrodes 21.

The electrons and the holes injected into the organic luminescent layer 23 move to the organic luminescent layer 23 under the electric field and are recombined with each other to form excitons. The electrons in the excited state of the excitons return to the ground state and emit a visible light.

Meanwhile, the patterning of the first electrodes, the second electrodes, the organic luminescent layers, electron injection layers and the organic common electrodes provided in the second substrate 20 will be described with reference to FIGS. 1 and 2.

First, a transparent conductive metal is deposited on the second substrate 20 to form the first electrodes 21 as anodes in the form of lines or pixels. Subsequently, an organic material such as photoacryl, polyimide, or the like is coated on the anode. Then the separators 32 are formed by performing photo-etching, thereby defining the contact part C surrounded by the separators 32.

Next, on the upper side of the first electrodes 21 between the separators 32, the R-, G-, and B-organic common layer 22, the R-, G-, and B-organic luminescent layers 23, and the R-, G-, and B-electron injection layers 25 are formed. The R-, G-, and B-organic common layer 22, the R-, G-, and B-organic luminescent layers 23, and the R-, G-, and B-electron injection layers 25 are respectively formed using a shadow mask 170.

More specifically, the shadow mask is disposed such that only the regions corresponding to the pixels of green color G are opened, and a G-organic common layer 22G, a G-organic luminescent layer 23G and a G-electron injection layer 25G are deposited in turn. Then the shadow mask is shifted to open only the regions corresponding to the pixels of blue color B, a B-organic common layer 22B, a B-organic luminescent layer 23B and a B-electron injection layer 25B are deposited in turn. Subsequently, the shadow mask is shifted to open only the regions corresponding to the pixels of red color R, and an R-organic common layer 22R, an R-organic luminescent layer 23R and an R-electron injection layer 25R are deposited in turn. During this process, the contact part is covered with the shadow mask such that the organic common layer, the organic luminescent layers and the electron injection layers are not formed in the contact part.

Further, the second electrodes 24 are formed on the second substrate 20 using an opened mask. Therefore, the second electrodes 24 in the contact part C are formed on the first electrodes 21 to electrically contact with each other. In addition, the second electrodes 24 in the regions other than the contact part C are formed on the electron injection layers 25. In the contact parts C, the first electrodes 21 connect the connection electrodes 41 indirectly via the second electrodes 24 to transmit electric signals.

If using the opened mask to form the organic common layers, the organic luminescent layers and the electron injection layers 25, insulator organic common layers, insulator organic luminescent layers and electron injection layers will be formed in the contact part so that the first electrodes are not electrically connected to the second electrodes. In order to prevent this, the shadow mask is used when forming the organic common layers, the organic luminescent layers and the electron injection layers. However, when using the shadow mask to form the organic common layers, the organic luminescent layers and the electron injection layers, the process time is prolonged and is complicated.

SUMMARY OF THE INVENTION

Accordingly, the present invention is directed to an organic electroluminescent display device and a method for fabricating the same that substantially obviates one or more problems due to limitations and disadvantages of the related art.

An object of the present invention is to provide an organic electroluminescent display device and a method for fabricating the same in which the conductive polymer is used for an organic common layer on the second substrate with without a mask such that the process time and the manufacturing costs associated with the mask are reduced.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescent display device includes a driving thin film transistor in a pixel region of a first substrate; a first electrode on a second substrate opposite to the first substrate; a separator on the second substrate to define a contact part on the second substrate; an organic common layer on the first electrode within the contact part and outside the contact part; an organic luminescent layer on the organic common layer outside the contact part; an electrode injection layer on the organic luminescent layer; a second electrode on the electrode injection layer within the contact part and on the organic luminescent layer; and a connection electrode connecting the driving thin film transistor to the second electrode.

In another aspect of the present invention, a method for fabricating an organic electroluminescent display device comprises the steps of forming a driving thin film transistor on a first substrate in a pixel region; forming a connection electrode connected to the driving thin film transistor; forming a first electrode in a second substrate opposite to the first substrate; forming a separator on the second substrate to define a contact part on the second electrode; forming an organic common layer on the first electrode within the contact part and outside the contact part; forming an organic luminescent layer on the organic common layer outside the contact part; forming an electron injection layer on the organic luminescent layer; forming a second electrode on the electron injection layer; and oppositely bonding the first substrate to the second substrate such that the connection electrode contacts the second electrode.

In another aspect of the present invention, an organic electroluminescent display device comprises a connection electrode on a first substrate; and a luminescent element on a second substrate opposite to the first substrate, the luminescent element being connected to the connection electrode, the luminescent element having a contact part at least partially surrounded by a separator, wherein a first electrode, a second electrode and an organic common layer between the first electrode and the second electrode are located in the contact part.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Hereinafter, an organic electroluminescent display device according to an embodiment of the present invention and a method for fabricating the same will be described in detail with reference to the accompanying drawings.

Figure 1:
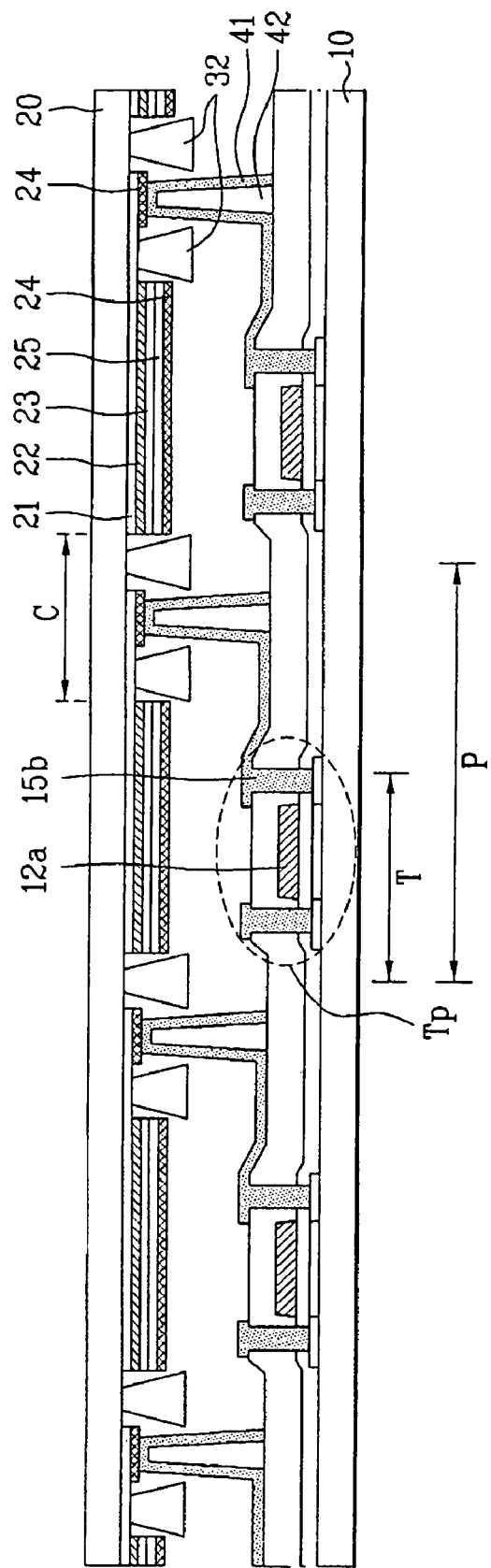
FIG. 1 illustrates a cross-sectional view of a conventional organic electroluminescent display device.
Figure 2:
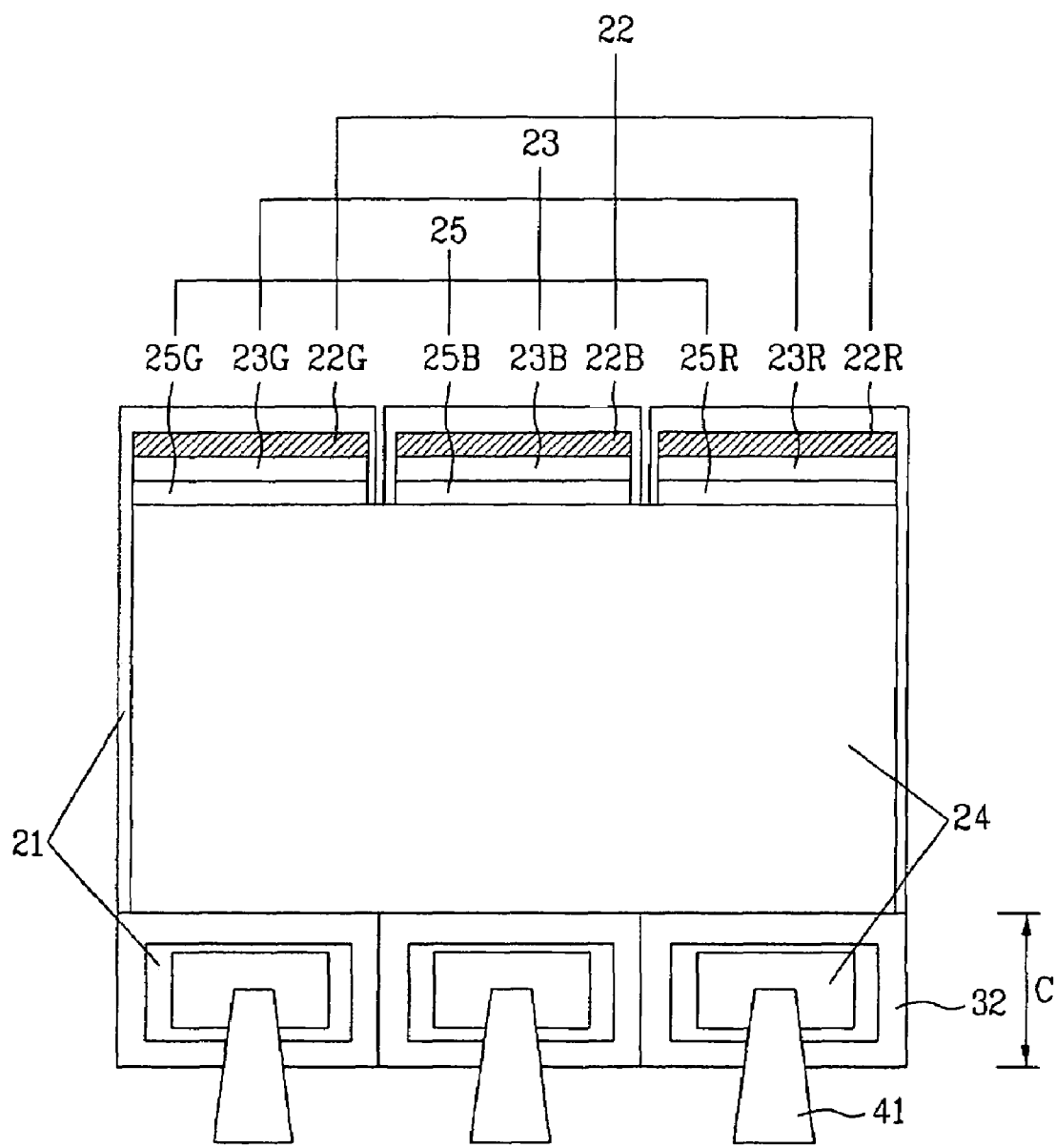
FIG. 2 illustrates a plan view of the conventional organic electroluminescent display device.
Figure 3:
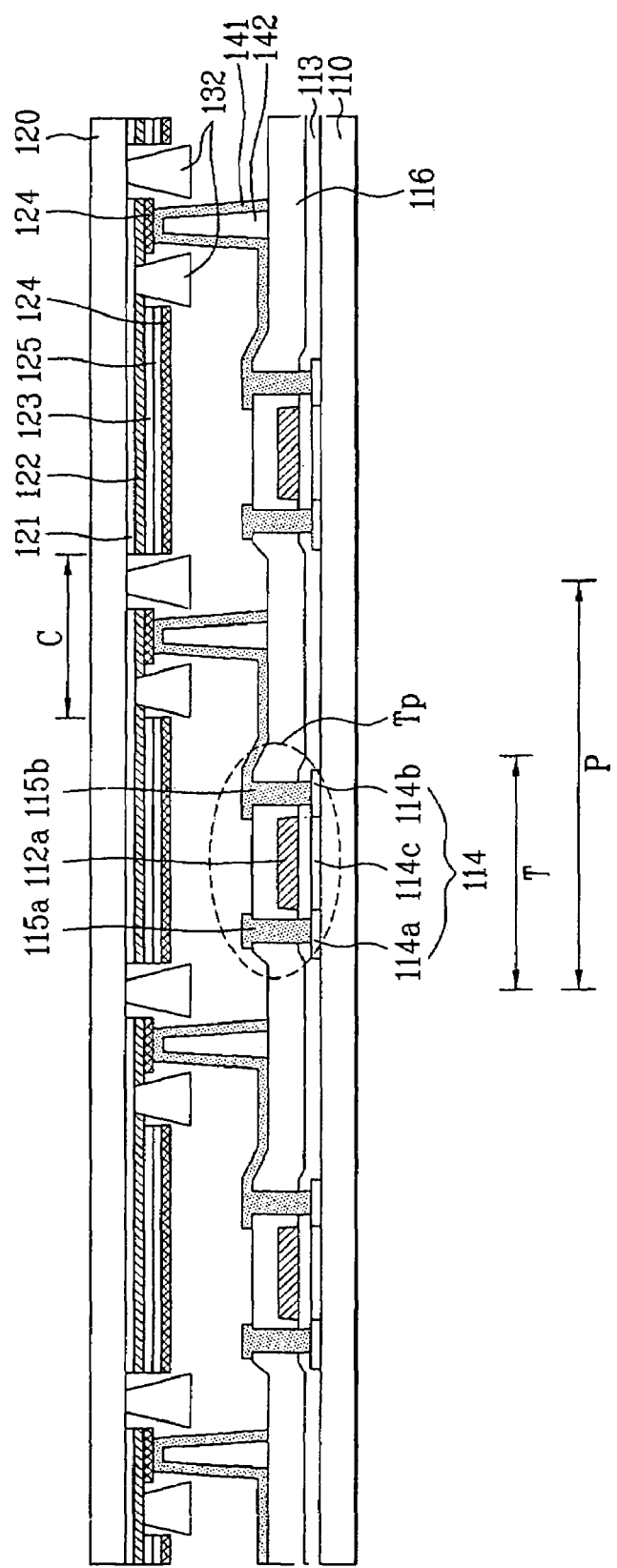
FIG. 3 illustrates a cross-sectional view of an organic electroluminescent display device according to an embodiment of the present invention.
Figure 4:
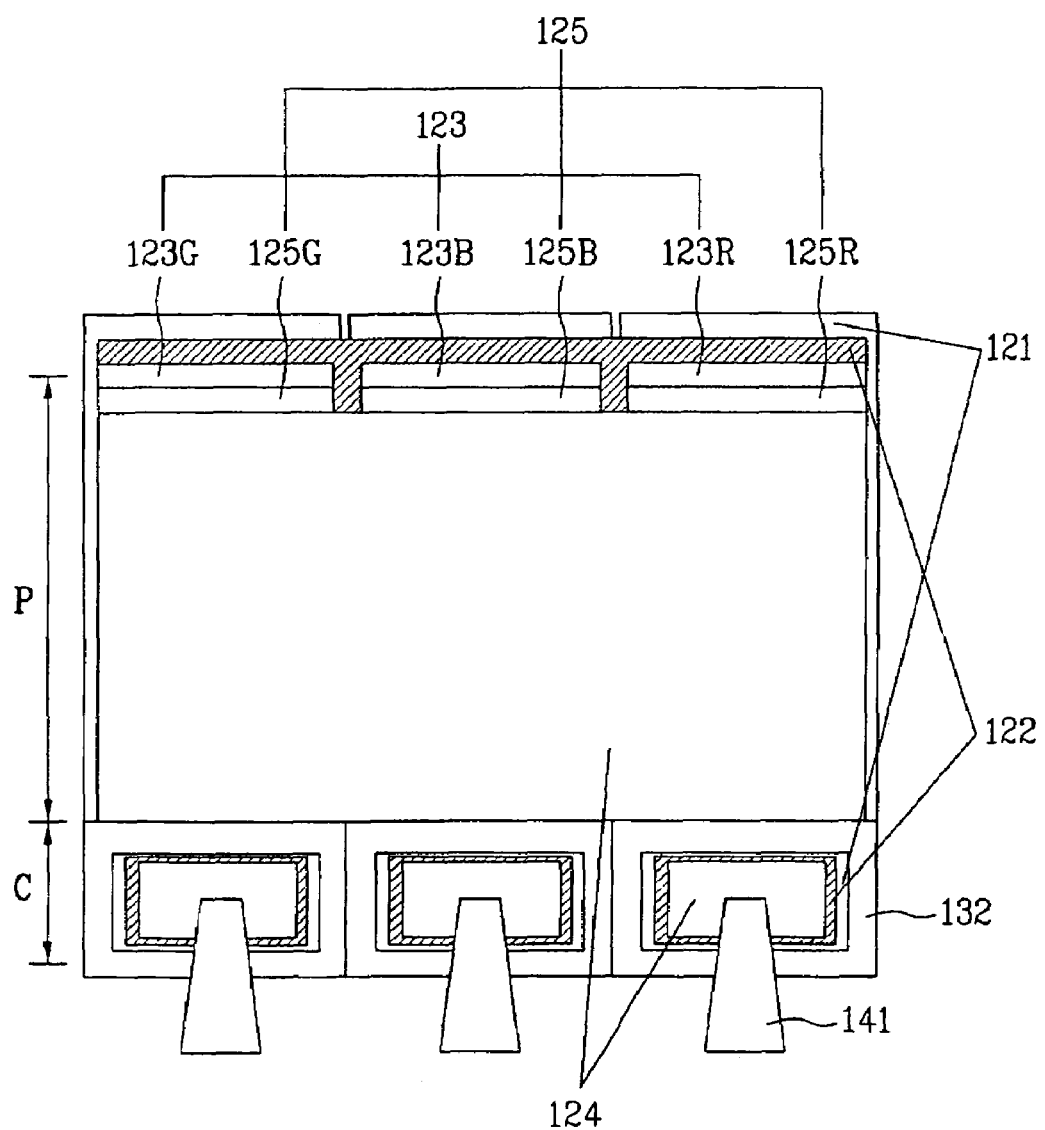
FIG. 4 illustrates a plan view of the organic electroluminescent display device according to an embodiment of the present invention.
Figure 5:
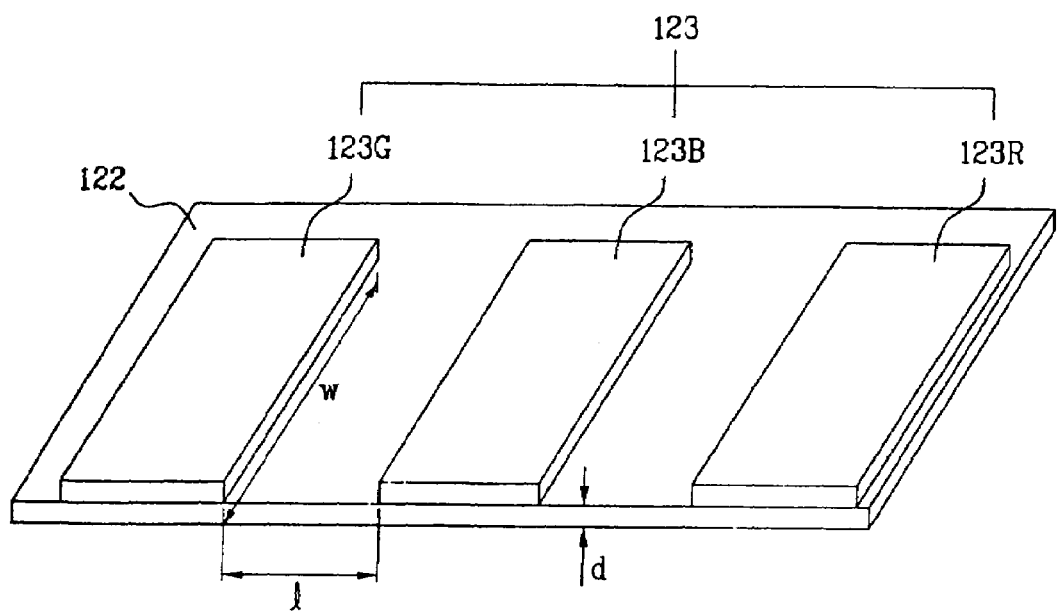
FIGS. 5 and 6 illustrate electric properties of the organic electroluminescent display device according to an embodiment of the present invention.
Figure 6:
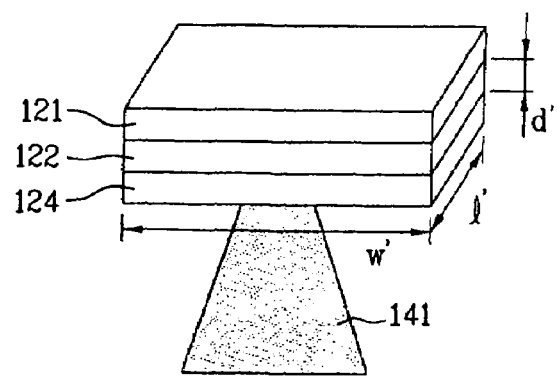

FIG. 3 illustrates a cross-sectional view of the organic electroluminescent display device according to an embodiment of the present invention, FIG. 4 illustrates a plan view of the organic electroluminescent display device according to an embodiment of the present invention. FIGS. 5 and 6 illustrate electric properties of the organic electroluminescent display device according to an embodiment of the present invention.

The organic electroluminescent display device according to an embodiment of the present invention, as shown in FIGS. 3 and 4, includes a first substrate 110 defined a plurality of pixels (luminescent parts) P and having switching thin film transistors Ts (not shown) and driving thin film transistors Tp, and a second substrate 120 having first electrodes 121, organic common layers 122, the organic luminescent layers 123, the electron injection layers 125 and second electrodes 124, which are laminated, and has a dual-plate structure. The organic common layers are formed of a conductive polymer on the second substrate 120 without a mask. Therefore, a process of forming the organic common layer is simplified.

The second electrodes 124 outside the contact parts C receive the electric signals from the peripheral region surrounding the active region, and the second electrodes 124 in the contact parts C receive electric signals through the connection electrodes 141. The conductive polymer layers as the organic common layers 122 are disposed between the second electrodes 124 and the first electrodes 121 in the contact parts C.

More specifically, on the first substrate 110, the pixels are defined by the gate lines arranged in a single row. The data lines and power lines perpendicularly cross the gate lines and are spaced apart from each other by predetermined intervals The switching thin film transistors Ts (not shown) are disposed where the gate lines cross the data lines, and the driving thin film transistors Tp are disposed where the gate lines cross the power lines.

Each of the driving thin film transistors Tp includes a gate electrode 112a, a gate insulating layer 113, an active layer 114, a source electrode 115a, and a drain electrode 115b.

If the active layers 114 are formed with poly-crystal silicon, the driving thin film transistors may be top-gate type thin film transistors in which the gate electrodes are disposed on the upper sides thereof, the source electrodes 115a and the drain electrodes 115b are respectively connected to the source regions 114a and the drain regions 114b of the active layers 114, and the active layers between the source regions 114a and the drain regions 114b become channel layers 114c. This structure is equally applied to the switching thin film transistors Ts.

The active layers may be formed of amorphous silicon. In this case, the driving thin film transistors may be bottom-gate type thin film transistors in which the gate electrodes are disposed in the lower sides thereof.

The connection electrodes 141 are formed on the surface of contact spacers 142 which are formed on a passivation layer 116. The contact spacers 142 are pillar-shaped organic patterns, and are formed by photo etching using photoresist. The organic insulating material such as photoacryl, polyimide, and the like are used for forming the contact spacers 142. The contact spacers have the same height as the gap between the first substrate 110 and the second substrate 120.

The second substrate 120 includes the first electrodes 121 as the transparent hole-injection electrodes, the organic common layers 122 formed on the surface of first electrodes 121, an R-organic luminescent layer 123R, a G-organic luminescent layer 123G, and a B-organic luminescent layer 123B, which are independently formed in the respective pixels on the organic common layer 122, an R-electron injection layer 125R, a G-electron injection layer 125G, and a B-electron injection layer 125B, which are independently formed in the respective R-, G-, and B-organic luminescent layers 123R, 123G and 123B, and the second electrodes 124 as electron injection electrodes disposed on the electron injection layers 125.

The separators 132 are formed along the circumferences of the contact parts C to define the contact parts in the pixels. The connection electrodes 141 contact the second electrodes 124 at the contact parts C, and the electric signals are transmitted to the first electrodes 121 via the organic common layers 122 and the second electrodes 124.

Hereinafter, the method for fabricating the organic electroluminescent display device according to an embodiment of the present invention will be described.

First, the second substrate 120 is deposited and patterned with a transparent metal having a high work function such as indium tin oxide (ITO) such that the first electrodes 121 are made in the form of lines or pixels.

On the side of the second substrate 120 containing the first electrodes 121, the organic insulating material such as photoacryl, polyimide, and the like is coated, and a photo etching process is carried out to form the inverse-taper-shaped separators 132 along the circumferences of the contact parts C.

Next, in an opened state that the side of the second substrate 120 containing the separators 132 is not covered with the mask, the conductive polymer is coated to form the organic common layers 122. Therefore, the organic common layers 122 are integrally formed on the first electrodes 121 within the contact parts C and on the first electrodes 121 outside the contact parts C, which are separated by the separators 132. In the illustrated embodiment as shown in FIG. 3, the separators 132 at its lateral sides are in contact with the organic common layer within the contact parts C and the organic common layer outside the contact parts C.

Without using the mask, manufacturing costs caused by using the mask can be reduced, the organic common layers are easily formed, and the process time can be also reduced. The organic common layers 122 in this embodiment include the conductive polymer hole-injection layer and the hole-transporting layer.

The organic luminescent layers 123 and the electron injection layers are formed using the shadow mask. In other words, the shadow mask is disposed to open only the regions corresponding to green pixels G such as the G-organic luminescent layer 123G and the G-electron injection layer 125G is deposited. Then the shadow mask is sifted to open only the regions corresponding to blue pixels B such that the B-organic luminescent layer 123B and the B-electron injection layer 125B is deposited. Subsequently, the shadow mask is shifted to open only the regions corresponding to red pixels R such that the R-organic luminescent layer 123R and the R-electron injection layer 125R is deposited. The contact parts C are covered by the shadow mask such that the organic luminescent layers and the electron injection layers are not formed in the contact parts C.

Finally, the second electrodes 124 are formed on the electron injection layers 125 outside the contact parts C and on the organic common layers 122 within the contact parts C, which are separated by the separators 132. The second electrodes 124 are extended to the peripheral region surrounding the active region and receive the electric signals. The first electrodes 121 are electrically connected to the connection electrodes 141 within the contact parts C through the organic common layers 122 and the second electrodes 124. Since the organic common layers 122 are the conductive polymers having electrical properties, the first electrodes 121 receive electric signals from the connection electrode 141 via the organic common layers 122 and the second electrodes 124 within the contact parts C.

In an embodiment, the second electrodes 124 are cathode electrodes, and are fabricated by selecting a metal containing calcium (Ca), magnesium (Mg), and/or aluminum (Al).

The second substrate 120 are oppositely bonded to the first substrate 110 such that the connection electrodes 141 of the first substrate 110 contact the second electrodes 124 of the second substrate 120.

In the organic electroluminescent display device of the illustrated embodiment, the lateral cross talk in the pixels due to the organic common layers can be easily prevented. For example, if the distance between the organic luminescent layers 123, i.e., the distance between adjacent pixels is about 20 µm, the lateral cross talk can be prevented.

More specifically, as shown in FIG. 5, the distance 1 between the pixels is 20 µm, a length W of the organic luminescent layer 123 is 277 µm, a thickness d of the organic common layer 122 is 50 nm, and the resistance density p of the organic common layer 122 is 10 $e^6$ Ωcm. Therefore, resistance between pixels is estimated as follows:

$R = \rho \times 1/(W \times d)$ $= 10e^6$ Ωcm×20 µm/(277 µm×50 nm)

$= 10e^{10}$ Ωµm×20 µm/(277 µm×50×10$^{-3}$ µm)

$= 2e^{12}$ Ωµm$^2$/(14 µm$^2$) = 0.14$e^{12}$ Ω = 1.4$e^{11}$ Ω.

In other words, resistance between the pixels due to the organic common layer is 1.4$e^{11}$ Ω, which is high enough to prevent the lateral cross talk.

Therefore, the distance 1 between the pixels may be, but not limited to about 20 µm, or from about 5 µm to about 20 µm in the illustrated embodiment.

Moreover, in the contact parts, there is no risk of undesired electrical connection defect between the first electrodes 121 and the second electrodes 124.

More specifically, as shown in FIG. 6, when the thickness d of the organic common layers 122 is 50 nm, the length W' is 79 µm, the width 1' is 50 µm, and the resistance density ρ is 10$e^6$ Ωcm, the resistance of the organic common layers is estimated as follows:

$R = \rho \times d/(W' \times 1')$ $= 10e^6$ Ωcm×50 nm/(79 µm×50 µm)

$= 10e^{10}$ Ωµm×50×10$^{-3}$ µm/(79 µm×50 µm)

$= 500e^7$ Ωµm$^2$/(3950 µm$^2$) = 0.13$e^7$ Ω = 1.3$e^6$ Ω.

In other words, assuming that the voltage and electric current actually applied to a panel are about 12V and 1 µA, the resistance of the organic common layers is 12 MΩ. The resistance increase due to the organic common layers made of the conductive polymer is 1.3 MΩ, and the current reduction due to the organic common layers is very small, about 10%.

Therefore, the organic common layers are formed with the conductive polymer so that the process time can be reduced without electrical connection defect.

The organic electroluminescent display device and the method for fabricating the same as illustrated have the following advantages.

By forming the organic common layers with the conductive polymer, the organic common layers can be formed in the opened state, i.e., without using a mask.

Therefore, manufacturing costs associated with the shadow mask can be reduced, the organic common layers are easily formed, and the process time can be also reduced.

In addition, it is possible to form the electrode injection layers with the conductive polymer. By forming the electrode injection layers with the conductive polymer, the electrode injection layers can be formed in the opened state, i.e., without using a mask. The electrode injection layers are formed on the upper side of the R-, G-, and B-organic luminescent layers after depositing the R-organic luminescent layer, the G-organic luminescent layer, and a B-organic luminescent layer with a shadow mask.

As mentioned above, when the electron injection layer is made of a conductive polymer, the electron injection layer can be formed free of a mask such that the electron injection layer is formed within the contact part C and outside the contact part C. The electron injection layer within the contact part C and the electron injection layer outside the contact part C are separated by the separator.

Therefore, the first electrode, the organic common layer, the electron injection layer and the second electrode are laminated in turn in the contact part C, and the first electrode, the organic common layers, the organic luminescent layer, the electron injection layers and the second electrode are laminated in turn outside the contact part C.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescent display device comprising:
   a driving thin film transistor in a pixel region of a first substrate;
   a first electrode on a second substrate opposite to the first substrate;
   a separator on the second substrate to define a contact part on the second substrate;
   an organic common layer on the first electrode within the contact part and outside the contact part;
   an organic luminescent layer on the organic common layer outside the contact part;
   an electron injection layer on the organic luminescent layer;
   a second electrode on the electrode injection layer within the contact part and on the organic luminescent layer; and
   a connection electrode connecting the driving thin film transistor to the second electrode.

2. The device of claim 1, wherein the organic common layer is made of a conductive polymer.

3. The device of claim 1, wherein the second electrode is in contact with the organic common layer within the contact part.

4. The device of claim 1, wherein the organic luminescent layer includes an R-organic luminescent layer, a G-organic luminescent layer, and a B-organic luminescent layer.

5. The device of claim 1, wherein the first electrode is made in a form of a line or a pixel.

6. The device of claim 1, wherein the separator is along a circumference of the contact part.

7. The device of claim 1, wherein the first electrode, the organic common layer, and the second electrode are laminated in turn in the contact part, and the first electrode, the organic common layers, the organic luminescent layer, the electron injection layers and the second electrode are laminated in turn outside the contact part.

8. The device of claim 1, wherein the separator is in contact with the organic common layer.

9. The device of claim 1, wherein the organic common layer within the contact part and the organic common layer outside the contact part are separated by the separator.

10. The device of claim 1, wherein the second electrode on the organic common layer within the contact part and the second electrode on the electron injection layers are separated by the separator.

11. The device of claim 1, wherein the second electrode within the contact part is between the organic common layer and the connection electrode.

12. The device of claim 1, wherein the organic common layer within the contact part is located between the first electrode and the second electrode.

13. The device of claim 1, further comprising:
   a gate line, a data line, and a power line on the first substrate to define the pixel region; and
   a switching thin film transistor in the pixel region.

14. The device of claim 1, wherein the electron injection layer is made of a conductive polymer.

15. The device of claim 14, wherein the electron injection layer is formed within the contact part and outside the contact part.

16. The device of claim 15, wherein the electron injection layer within the contact part and the electron injection layer outside the contact part are separated by the separator.

17. The device of claim 15, wherein the first electrode, the organic common layer, the electron injection layer and the second electrode are laminated in turn in the contact part, and the first electrode, the organic common layers, the organic luminescent layer, the electron injection layers and the second electrode are laminated in turn outside the contact part.

18. A method for fabricating an organic electroluminescent display device, the method comprising:
   forming a driving thin film transistor on a first substrate in a pixel region;
   forming a connection electrode connected to the driving thin film transistor;
   forming a first electrode in a second substrate opposite to the first substrate;
   forming a separator on the second substrate to define a contact part on the second electrode;
   forming an organic common layer on the first electrode within the contact part and outside the contact part;
   forming an organic luminescent layer on the organic common layer outside the contact part;
   forming an electron injection layer on the organic luminescent layer;
   forming a second electrode on the electron injection layer; and
   oppositely bonding the first substrate to the second substrate such that the connection electrode contacts the second electrode.

19. The method of claim 18, wherein the organic common layer is formed free of a mask.

20. The method of claim 18, wherein the step of forming the organic common layer is carried out free of a patterning process.

21. The method of claim 18, wherein the step of forming the organic common layer includes forming a conductive polymer as the organic common layer.

22. The method of claim 18, wherein the step of forming the organic common layer includes using a coating method to form the organic common layer.

23. The method of claim 18, wherein the step of forming the first electrode includes patterning the first electrode in the form of a line or a pixel.

24. The method of claim 18, wherein the step of forming the electron injection layer is performed immediately after the step of forming the organic luminescent layer.

25. The method of claim 24, wherein the steps of forming the organic luminescent layer and the electron injection layer include:
   forming an R-organic luminescent layer and an R-electron injection layer;
   forming a G-organic luminescent layer and a G-electron injection layer; and
   forming a B-organic luminescent layer and a B-electron injection layer.

26. The method of claim 25, wherein the steps of forming the organic luminescent layer and the electron injection layer include using a shadow mask to form the R, G, B organic luminescent layers and the R, G, B electron injection layer.

27. The method of claim 26, wherein the step of forming the organic luminescent layer and the electron injection layer includes using the shadow mask to cover the contact part.

28. The method of claim 18, wherein the step of forming the second electrode is carried out free of a patterning process.

29. The method of claim 18, wherein the step of forming the second electrode includes using an opened mask to form the second electrode.

30. The method of claim 18, wherein the step of forming the organic common layer includes forming the organic common layer to be in contact with the separator.

31. The method of claim 18, wherein the step of forming the organic common layer includes using the separator to separately form the organic common layer within the contact part and the organic common layer outside the contact part.

32. The method of claim 18, wherein the step of forming the organic luminescent layer includes using the separator to separately form the second electrode on the organic common layer within the contact part and the second electrode on the organic luminescent layer.

33. The method of claim 18, wherein the step of forming the separator includes forming the separator along a circumference of the contact part on the second electrode.

34. The method of claim 18, wherein the step of forming the second electrode includes forming the second electrode within the contact part to be located between the organic common layer and the connection electrode.

35. The method of claim 18, wherein the step of forming the organic common layer includes forming the organic common layer within the contact part to be located between the first electrode and the second electrode.

36. The method of claim 18, further comprising
forming a gate line on the first substrate;
forming a data line and a power line crossing the gate line to define the pixel region; and
forming a switching thin film transistor in the pixel region.

37. The method of claim 18, wherein the step of forming the electron injection layer includes forming a conductive polymer.

38. The method of claim 37, wherein the electron injection layer is formed free of a mask.

39. The method of claim 38, wherein the step of forming the electron injection layer includes using the separator to separately form the electron injection layer within the contact part and the electron injection layer outside the contact part.

40. The method of claim 38, wherein the step of forming the organic luminescent layer and the step of forming the electron injection layer includes:
forming an R-organic luminescent layer;
forming a G-organic luminescent layer;
forming a B-organic luminescent layer; and
forming the electron injection on the R, G, B organic luminescent layers.

41. The method of claim 40, wherein the steps of forming the organic luminescent layer include using a shadow mask to form the R, G, B organic luminescent layers.

42. An organic electroluminescent display device comprising:
a connection electrode on a first substrate; and
a luminescent element on a second substrate opposite to the first substrate, the luminescent element being connected to the connection electrode, the luminescent element having a contact part at least partially surrounded by a separator, wherein a first electrode, a second electrode and an organic common layer between the first electrode and the second electrode are located in the contact part.

43. The device of claim 42, wherein the organic common layer is made of a conductive polymer.

44. The device of claim 42, wherein the organic common layer in the contact part is in contact with the first electrode and the second electrode in the contact part.

45. The device of claim 42, wherein the organic common layer is in contact with the separator.

46. The device of claim 42, wherein the luminescent element has a luminescent part outside the contact part for emitting a light when a voltage difference is applied between the first electrode and the second electrode.

47. The device of claim 46, wherein the organic common layer is also located in the luminescent part, the organic common layer in the luminescent part being in contact with the separator.

* * * * *